(12) United States Patent
Flach et al.

(10) Patent No.: US 6,777,924 B2
(45) Date of Patent: Aug. 17, 2004

(54) METHOD AND MAGAZINE DEVICE FOR TESTING SEMICONDUCTOR DEVICES

(75) Inventors: Björn Flach, München (DE); Wolfgang Ruf, Friedberg (DE); Martin Schnell, München (DE); Jörg Stippler, München (DE); Andreas Logisch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/377,348

(22) Filed: Feb. 28, 2003

(65) Prior Publication Data

US 2003/0173950 A1 Sep. 18, 2003

(30) Foreign Application Priority Data

Feb. 28, 2002 (DE) .......................... 102 08 757

(51) Int. Cl.[7] .......................... G01R 1/04; G01R 31/26
(52) U.S. Cl. .................... 324/158.1; 324/765
(58) Field of Search .............. 324/158.1, 754, 324/765; 414/796.5, 798.9, 403–404, 413–417

(56) References Cited

U.S. PATENT DOCUMENTS 4,687,403 A * 8/1987 Motoda ................... 414/788.4
5,148,100 A * 9/1992 Sekiba ....................... 324/765
5,175,491 A   12/1992 Ewers
5,313,156 A * 5/1994 Klug et al. ............... 324/158.1
6,135,699 A * 10/2000 Yutaka et al. ............ 324/158.1
6,163,145 A * 12/2000 Yamada et al. .......... 324/158.1

FOREIGN PATENT DOCUMENTS

DE     197 43 211 A1    6/1998

* cited by examiner

Primary Examiner—Kamano Cuneo
Assistant Examiner—Jermele Hollington
(74) Attorney, Agent, or Firm—Laurence A. Greenberg; Werner H. Stemer; Ralph E. Locher (57) ABSTRACT

A method and device allow testing functionally identical semiconductor devices on a programmable testing device. The semiconductor devices are placed in magazine devices and a uniform magazine interface with respect to the testing device is provided for similar semiconductor devices in different types of packages. The semiconductor devices are advantageously tested one after the other on a testing device essentially without deference to their type of package and without any mechanical conversions being necessary on the testing device.

21 Claims, 4 Drawing Sheets

METHOD AND MAGAZINE DEVICE FOR TESTING SEMICONDUCTOR DEVICES

BACKGROUND OF THE INVENTION

Field of the Invention

The invention lies in the semiconductor technology and semiconductor processing field. More specifically, the present invention relates to a method for testing a plurality of semiconductor devices on a programmable testing device by means of magazine devices. The testing device has at least one testing location with a plurality of electrical contact devices as a testing location interface and each magazine device has a magazine shaft with a first magazine interface, forming the counterpart to the testing location interface, and also a plurality of second magazine interfaces for the contacting of a semiconductor device in each case. In the generic method,

- a plurality of semiconductor devices are arranged one above the other in the magazine shaft;
- the magazine shaft is mechanically fastened on the testing location and contacted; and
- subsequently, the semiconductor devices in the magazine shaft are simultaneously tested.

In addition, the present invention relates to magazine devices which render such a method possible.

At present, the costs for testing semiconductor devices form a significant part of the overall production costs. In the case of semiconductor memory devices, such as 128 Mb DRAMs (dynamic random access memories), the proportion of production costs made up by testing costs is approximately 15% to 20%.

The testing of semiconductor devices (hereafter also test pieces) generally takes place on programmable testing devices (component testers). If a high throughput of test pieces is required, the testing devices are operated in conjunction with automatic placement machines (handlers).

The automatic placement machine removes the test pieces from a storage device and places them on one of generally a number of testing locations of the testing device. At the testing location, the test piece is mechanically fixed. The fixing by the automatic placement machine in this case takes place for instance by pressure being applied or by a fastening interface to be closed and opened by the automatic placement machine.

The mechanical fixing at the same time ensures an electrically conducting connection between each contact device of the test piece on the one hand and a respectively corresponding contact device of the testing location on the other hand.

Usually, a plurality of testing locations are mechanically combined to form a test board. While a first test board is being loaded with test pieces by the automatic placement machine, the test pieces are being simultaneously tested in parallel with this on the testing device, on an already loaded, second test board.

Since the testing time per semiconductor device is fixed essentially by the functionality of the semiconductor device, the testing costs can be lowered only by a higher throughput of test pieces on the testing device. For this purpose, it is endeavored to reduce further the number of setting-up and loading times on the testing device and increase the number of test pieces tested in parallel.

To lower the testing costs of complex semiconductor devices which have an internal self-testing device (BIST), the commonly assigned, copending application Ser. No. 10/272,344, filed Oct. 15, 2002 therefore describes a magazine device (hereafter magazine) with which a plurality of complex semiconductor devices are simultaneously fixed and contacted at a testing location of a testing device. The internal self-testing device of the semiconductor devices compresses the test result for the tested semiconductor device and outputs the compressed result on a data line in each case (test port) of the test piece.

This allows both the address lines and the control lines of a plurality of semiconductor devices arranged in the magazine to be led while connected to one another to one output port of the testing location in each case. By contrast, the data lines (test ports) at which the test reactions of the test piece are output are respectively led separately to an input port of their own in each case of the testing location. Consequently, a simultaneous stimulation of the test pieces in the magazine takes place via the parallel-connected address and control lines and an essentially simultaneous, compressed fault output takes place on separate data lines.

The parallelism of the testing operation is increased by a factor corresponding to the number of test pieces per magazine.

Faulty contacts between the test piece and the testing device during the testing operation make up a further contribution to the testing costs. One reason for faulty contacts is the wearing of the contact devices of the testing device caused by the high throughput on the testing device and another is the configuration of the contact devices of the test pieces. The latter are generally intended to be soldered in later and are designed correspondingly. On the other hand, the contact devices of the test piece are only pressed during the testing on the testing device.

If, instead of the test piece, a magazine with contact devices which are not intended to be soldered in later is contacted at the test location, these contact devices can be designed for optimum and low-wearing operation in conjunction with the testing location.

In addition, the filling of the magazine and a simple test of the contacting of the semiconductor devices takes place with the magazine outside the actual testing device, by simple and low-cost means in relation to the testing device. Since contacting problems between the test piece and the testing device during the test do not block any of the testing locations of the testing device, the capacity utilization of the testing device is further increased.

The interface of the magazine devices with respect to the testing location is in this case designed in such a way that it electrically and mechanically simulates in each case a single test piece of the same or similar type of the test pieces arranged in the magazine.

Usually, a specifically configured test interface of the testing location is to be provided in this case for each type of package (TSOP, FBGA). When changing the type of test piece, conversions are necessary both at the testing locations and on the automatic placement machines.

A disadvantage of this method is the complex contacting via the side walls of the magazine device, since on the one hand it must be ensured that suitable pressure of the side wall is applied to the contact devices of the test pieces without the contact devices deforming or bending, for instance in the case of forms of package such as TSOP. On the other hand, in the case of types of package such as FBGA, at least some of the contact devices of the test piece are not readily accessible from the side.

In the same way as necessary changing of the test program, adaptation of the testing location and the automatic placement machine to the type of package again similarly contributes to the testing costs. This has until now even applied when functionally identical semiconductor devices in different types of package are tested one after the other on the same testing device.

Such converting of the placement device and testing device is an operation which is complex and time-consuming in each case and, moreover, significantly reduces the availability of the testing device.

A further disadvantage of stacking test pieces directly one on top of the other in a magazine device is the lack of convection in the magazine and the associated lack of heat dissipation from the test pieces, with the result that the temperature of the test pieces can sometimes exceed the maximum permissible limiting temperature for testing.

SUMMARY OF THE INVENTION

It is accordingly an object of the invention to provide a method for testing semiconductor devices, which overcome the above-mentioned disadvantages of the heretofore-known devices and methods of this general type and which provide a method with which, when testing semiconductor devices on testing devices by means of magazine devices, the number of converting operations on the testing device and on an automatic placement machine which feeds the semiconductor devices to the testing device is reduced and the range of possible applications of magazine devices is extended. Furthermore, it is an object of the invention to provide magazine devices which make such a method possible.

With the foregoing and other objects in view there is provided, in accordance with the invention, a method for testing a plurality of semiconductor devices on a programmable testing device having at least one testing location with a plurality of first electrical contact devices defining a testing location interface. The method comprises the following steps:

providing a plurality of magazine devices each having a magazine shaft, a plurality of second electrical contact devices defining a first magazine interface, forming a counterpart to the testing location interface of the testing device, and each having a plurality of second magazine interfaces, formed by third electrical contact devices, for contacting a respective semiconductor device to be tested;

thereby providing a given magazine type for similar types of semiconductor devices enabled for testing with substantially a same set of testing signals and test patterns independently of one of a terminal assignment and a type of package thereof;

thereby providing each magazine type, respectively provided for mutually different semiconductor devices, with an identical first magazine interface with respect to the testing device;

arranging semiconductor devices to be tested one above the other in a magazine shaft of a magazine device;

mechanically fastening and contacting the magazine shaft on the testing location; and simultaneously testing a stack of similar semiconductor devices in the magazine shaft; and testing mutually different types of semiconductor devices in different types of package one after another substantially without conversions on the testing device.

With the above and other objects in view there is also provided, in accordance with the invention, a magazine device assembly for testing a plurality of functionally identical or similar types of semiconductor devices, the semiconductor devices being enabled for testing with substantially the same set of testing signals and test patterns independently of a terminal assignment or a type of package, and the testing to be carried out on a programmable testing device having at least one testing location with a testing location interface having a plurality of first contact devices, the magazine device assembly comprising:

a plurality of magazine devices each formed as a magazine shaft, each the magazine device having a first magazine interface forming a counterpart to the testing location interface and having second contact devices;

a plurality of second magazine interfaces having a plurality of electrical contact devices for receiving a plurality of stacked semiconductor devices; and the magazine shafts having identical magazine interfaces with respect to the testing device for functionally identical and similar semiconductor devices in different types of package.

According to the invention, the magazine devices are consequently intended for functionally identical semiconductor devices in different types of package with an identical interface with respect to the testing device. The identical interface neutralizes any variation of the test pieces arising from the different types of package with respect to the testing device. For the testing device, the test pieces then appear to be the same, irrespective of the type of package. This results in a series of improvements and advantages over previously known methods of testing.

For example, packages of the types TSOP-54 and FBGA-54 are customary for a semiconductor memory device which is functionally a 128 Mb DRAM. For the parallel and simultaneous testing of a plurality of test pieces, a special type of magazine is necessary for each type of package. If both types of magazine respectively have identical mechanical and electrical or optical interfaces with respect to the testing location of the testing device, the same testing locations and at least partly the same test program can be used for both types of package.

If, for instance, functionally identical or similar semiconductor devices in different types of package are alternately tested on a testing device, there is no longer any need for conversion of the testing device.

There is no need for the testing locations to be adapted or exchanged. Similarly, it is not necessary to keep differently designed testing locations and/or test boards available for functionally identical semiconductor devices.

If need be, small batches of a second type of package of a semiconductor device can be respectively tested in alternation with a first type of package on the same testing device even without extra costs or a time delay. The loading of the testing device is more variable, the capacity utilization better and the availability higher than in the case of customary methods of testing.

Since the magazine devices are not loaded on the complex testing device, but on an automatic placement machine, which is simple in relation to the testing device, and the correct contacting of the semiconductor devices (hereafter also test pieces) is pre-tested in a simple manner, the capacity utilization of the testing device is further increased.

In addition, the interface of the magazine device with respect to the testing location can be optimized, whereby the number of faulty contacts and the wearing of contact devices at the testing location is further reduced.

According to the method according to the invention, the magazine device is also intended for providing a uniform interface for functionally similar semiconductor devices.

In this respect, semiconductor devices are considered to be similar to one another if, irrespective of the assignment of the terminals and/or form of package, they can be tested by essentially the same set of testing signals and test patterns.

For example, complex semiconductor devices (systems on a chip, SOCs) are made available in great diversity, while containing functionally the same memory configurations (embedded DRAM, eDRAM). To test the eDRAM components, in the semiconductor device there is usually a self-testing device, which for its part has a functionally standardized test interface. For such SOCs, different forms of package can be chosen. This difference is neutralized again with respect to the testing device by appropriate configuration of the magazine devices. The same applies to SOCs in identical packages with different terminal assignment.

Also similar to one another for the purposes of the invention are, however, semiconductor memory devices such as 128 Mb DRAMs and 256 Mb DRAMs, since a first set of testing signals and test patterns is used for testing a 128 Mb DRAM and a genuine subset of a second set of testing signals and test patterns is used for testing a 256 Mb DRAM.

For the same reason, also similar to one another for the purposes of the invention are semiconductor memory devices of different data bus widths, and also semiconductor memory devices with different access times or differently specified supply voltage ranges. In the latter case, one magazine type has, for example, voltage control devices which make a first supply voltage range of a first type of semiconductor memory device match a second supply voltage range of a second type of semiconductor memory device, with the result that the two types of semiconductor memory device again appear identical to the testing device.

Semiconductor memory devices have in addition to an actual memory cell array further subcomponents, for instance a BIST (built-in self test) and interfaces. For example, SDRAMs and DDR-SDRAMs (double data rate synchronous DRAMs) have differently configured interfaces with respect to the external data bus. The memory cell arrays of the two types of DRAM can, however, be tested in virtually the same way, with the result that these semiconductor memory devices, too, can be considered as similar to one another; a comparable situation applies to RLDRAMs (reduced latency DRAMs) and SGDRAMs.

In addition, further examples of groups of semiconductor devices which are suitable for testing in magazine devices with uniform interfaces with respect to a testing location are also evident to a person skilled in the art.

The interfaces are made uniform in these cases by a suitable configuration of conductor tracks on the magazine device. In this case, at least a conversion of the testing location is not necessary even when functionally similar test pieces are successively tested on the same testing device.

Devising the test program correspondingly also makes it unnecessary for the test program to be changed when the type of test piece is changed. Alternatively, codings may be provided on the magazine interface and used as a basis by the testing device for detecting the type of test piece at the beginning of a testing cycle and correspondingly choosing a suitable test program automatically.

Preferably, magazine devices for different types of test piece are provided not only with a uniform interface with respect to the testing device but also with a uniform interface with respect to an automatic placement machine for the testing device. The interface with respect to the placement device is essentially dictated by the geometrical form and dimensions of the magazine device. With such an advantageous configuration of the magazine device, there is also no need for conversions to be made to the automatic placement machine when the type of test piece is changed.

One of the disadvantages of a simple arrangement of test pieces one next to the other or one above the other in a magazine device is the inadequate ventilation and cooling of the test pieces.

In a particularly preferred way, the magazine device is therefore provided as a magazine shaft and a plurality of identical carrier elements. Each such carrier element has in this case on one surface a receiving device for a semiconductor device. To prepare for testing a plurality of semiconductor devices, carrier elements and semiconductor devices are alternately arranged one next to the other or one above the other in series in the magazine shaft. With a corresponding configuration of the carrier elements, cooling of the test pieces during the testing cycle is provided as a result in a very simple way. Furthermore, with a suitable configuration of the receiving device, the loading of the magazine shaft is simplified.

Since lateral contacting of, for instance, the contact devices of TSO packages in a way which is reliable and at the same time does not harm the contact devices of the test piece proves to be difficult and, in addition, not all forms of package have exclusively laterally arranged contact devices, the carrier elements are preferably also provided as electrical adapting devices.

The semiconductor device is contacted by means of first contacting devices on a surface of the carrier element facing the loaded semiconductor device. Every first contact device is connected in an electrically conducting manner to a second contact device in each case on a surface facing the magazine shaft.

The provision of the carrier elements also as adapting devices extends the range of applications of the method according to the invention to virtually all types of package customary at present, such as BGAs (ball grid arrays) and flip-chips. In addition, the arrangement of test pieces with TSOP or PLCC packages is simplified, since, as originally intended for these types of package, the contacting does not take place laterally but from the underside of the package.

To improve the quality of testing signals generated by the testing device and carried to the test pieces, the magazine device is provided with a terminating element with terminating impedances for address, control and/or data lines, which is provided above the semiconductor device arranged uppermost in the magazine shaft.

The method according to the invention is based on the use of suitable magazine devices for testing in each case a plurality of identical semiconductor devices. Owing to the variability of semiconductor devices to be tested and the different types of package, a dedicated type of magazine device is required for each type of semiconductor device in each type of package.

In the simplest case, a magazine device in this case comprises a magazine shaft, wherein the test pieces are arranged next to one another or one above the other. The magazine shaft has a plurality of contact devices on at least one inner face of the magazine shaft for the electrical contacting of the test pieces, a mechanical and electrical interface with respect to a testing location of a testing device at one end of the shaft or on a side wall or end wall, and also electrical connections between the contact devices on the inner faces of the magazine shaft and an interface with respect to the testing location, which is configured as an electrical or an optical interface.

In the case of magazine devices of the type according to the invention, a uniform mechanical and electrical or optical interface with respect to the testing location of a testing device is configured for functionally identical semiconductor devices, irrespective of the type of package.

For example, a semiconductor memory device which is functionally a 128 Mb DRAM may be in a package of the TSOP-54 type or of the FGBA-54 type. For the parallel and simultaneous testing of a plurality of test pieces, a special type of magazine is necessary for each type of package. In this case, both types of magazine have respectively identical mechanical and electrical interfaces with respect to the testing location of the testing device. Consequently, the same testing location and the same test program can be used for both types of package.

If there is a change of the type of test piece, the necessity for a conversion of the testing location and partly also a change of the test program no longer exists.

In the case of testing devices which are intended for a very high throughput of test pieces, the test pieces are usually arranged on the testing locations by automatic placement machines. In this case, the part of the automatic placement machine which mechanically grasps the test piece is usually adapted to one type of package. A conversion of the placement device is then also necessary when there is a change in the type of magazine.

Adaptation of the testing location and the automatic placement machine to the type of package again contributes to the testing costs. This has until now even applied when functionally identical semiconductor devices in different types of package are tested.

Preferably, the magazine shafts of different magazine devices are provided in their outer form in such a way that different types of magazine act identically for the automatic placement machine. This can generally be realized in a simple way by the same outside dimensions for the magazine shafts.

In a further preferred embodiment, the electrical connections between the contact devices on the inner sides of the shaft and the contact devices at the interface with respect to the testing location in a magazine shaft are configured in such a way that functionally similar types of test piece are provided with types of magazine with the same interface with respect to the testing location in each case. For instance, both 128 Mb DRAMs and 256 Mb DRAMs are produced in packages of the TSOP-54 type.

A simple arrangement of test pieces one next to the other or one above the other in the magazine shaft can have the effect that, owing to a lack of convection, the test pieces are heated to above the maximum permissible temperature for testing. As a consequence, increased failure rates may occur, since the test is set at too high a level with respect to the thermal properties, or else the test pieces are damaged as a result of the increased temperature.

In a preferred way, the magazine device therefore has carrier elements. Then, there is respectively a carrier element and a test piece alternately arranged one next to the other or one above the other in the magazine shaft. The increased distance of the test pieces from one another avoids the test pieces heating up during testing beyond the temperature range specified for testing.

The carrier elements are advantageously provided with a receiving device for one test piece in each case, which device opens to an upper side of the carrier element. This type of configuration of the receiving device of the carrier elements has the effect that the test pieces are aligned when the magazine shaft is loaded.

A further advantageous configuration of a magazine device according to the invention is represented by arresting and centering devices on the upper side and/or underside of the carrier elements, which make it easier for the test pieces to be arranged and contacted in the magazine shaft.

Types of package wherein the contacting devices are not accessible, or not completely accessible, from the side, that is one of the narrow sides of the package, but partly or exclusively from the underside of the package (loading side) are also customary for semiconductor devices. On the carrier elements, therefore, first contact devices are preferably arranged on a surface respectively facing the loaded semiconductor device, second contact devices are preferably arranged on the surfaces facing the inner sides of the magazine shaft, and electrically conducting connections are preferably arranged between in each case a first contact device and a corresponding second contact device.

Such a configuration of the magazine device makes it possible for the method according to the invention also to be applied in the case of forms of package such as FBGA and PLCC. In this case, the first contact devices and/or the second contact devices may be formed as so-called pogo contacts or microspring contacts. Preferably, the contact devices are at least partly formed by Elastec technology. In this case, one contact device consists of an at least partly metallized silicon cone. In the simplest case, the metallization of the silicon cone is pressed against an opposite contact area. To produce the applied pressure necessary for this, the carrier elements have resilient devices, which are pressed together when the magazine shaft is filled.

Other features which are considered as characteristic for the invention are set forth in the appended claims.

Although the invention is illustrated and described herein as embodied in a method and magazine device for testing semiconductor devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
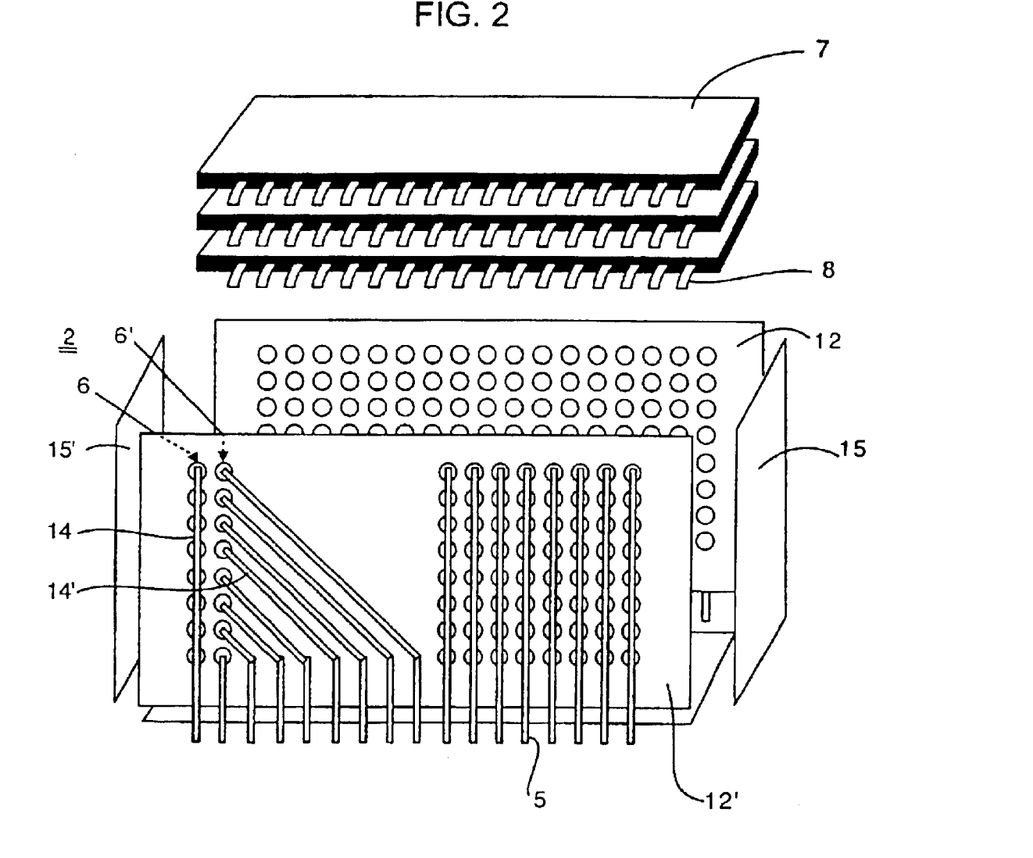
FIG. 2 is a perspective and schematic view of the magazine device according to a second exemplary embodiment of the invention.

Referring now to the figures of the drawing in detail and first, particularly, to FIG. 2 thereof, there is shown a magazine device that comprises a magazine shaft 2 for receiving test pieces 7 in packages of the TSOP type. The test pieces are arranged one above the other in this example. The magazine shaft 2 has two side walls 12, 12' and two end walls 15 and 15'. In the magazine shaft 2, the test pieces 7 are stacked one on top of the other. The side walls 12, 12' are configured as printed circuit boards, which respectively have contact devices 6 on surfaces, facing the interior of the shaft. The contact devices 6 of the side walls 12, 12' are in this case arranged such that, after the test pieces 7 are placed in the magazine shaft 2, they lie opposite the contact devices 8 of the test pieces 7.

Conductor tracks 14, 14', which in this example are arranged on surfaces of the side walls 12 and 12' facing the exterior of the shaft, connect the contact devices 6 of the side faces 12, 12' to contact devices 5 at a shaft end of the magazine shaft 2 facing the testing location. By means of the contact devices 5, the magazine shaft 2 is electrically connected to a testing location on a testing device, with the result that the interface with respect to the testing location is configured as an electrical interface.

The configuration of the conductor tracks 14, 14' results from the requirement for simultaneous testing of all the test pieces 7 arranged in the magazine shaft 2. Contact devices 6, at which output signals of the testing device, that is input signals of the test pieces 7, are exclusively present, are operated in parallel. The associated conductor tracks 14 consequently connect a plurality of contact devices 6, which for their part respectively lie opposite functionally equivalent contact devices 8 on the test pieces 7.

Contact devices 6', at which output signals of the test pieces 7 are present, are routed individually. In the example depicted, the test reaction of the test piece 7 is compressed to a test stimulation within the test piece 7 and output at in each case one of generally a number of data outputs of the test piece 7 at a test port. The contact devices 6' contacting the test ports are individually routed to the testing location via conductor tracks 14'. This allows the test pieces 7 to be stimulated in parallel and their response also to be read out in parallel.

Figure 3A:
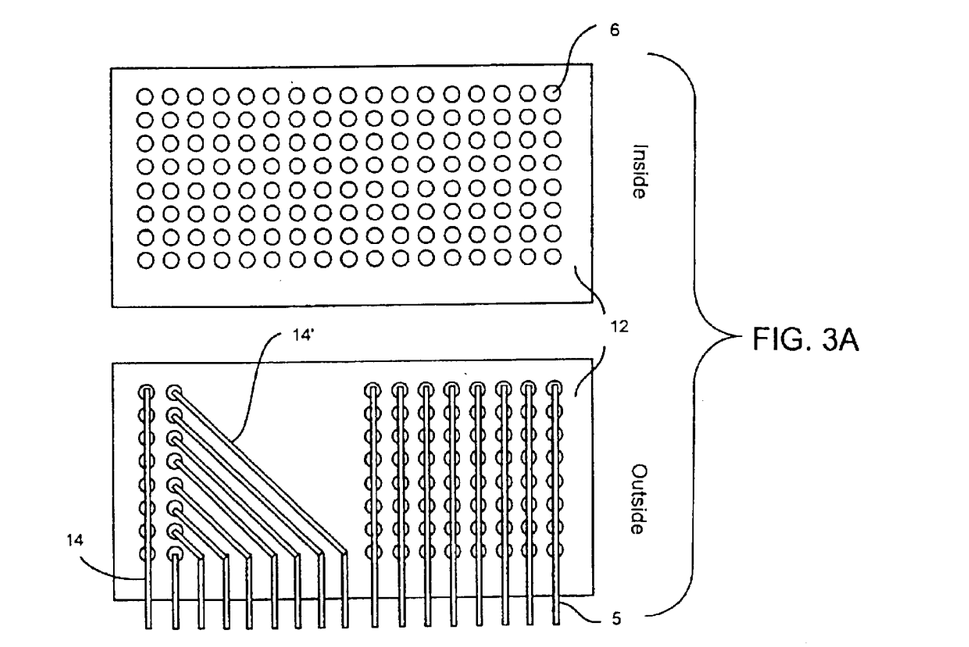
FIGS. 3A and 3B are schematic representations of the side walls of magazine shafts according to the second exemplary embodiment and a third exemplary embodiment of the invention.
Figure 3B:
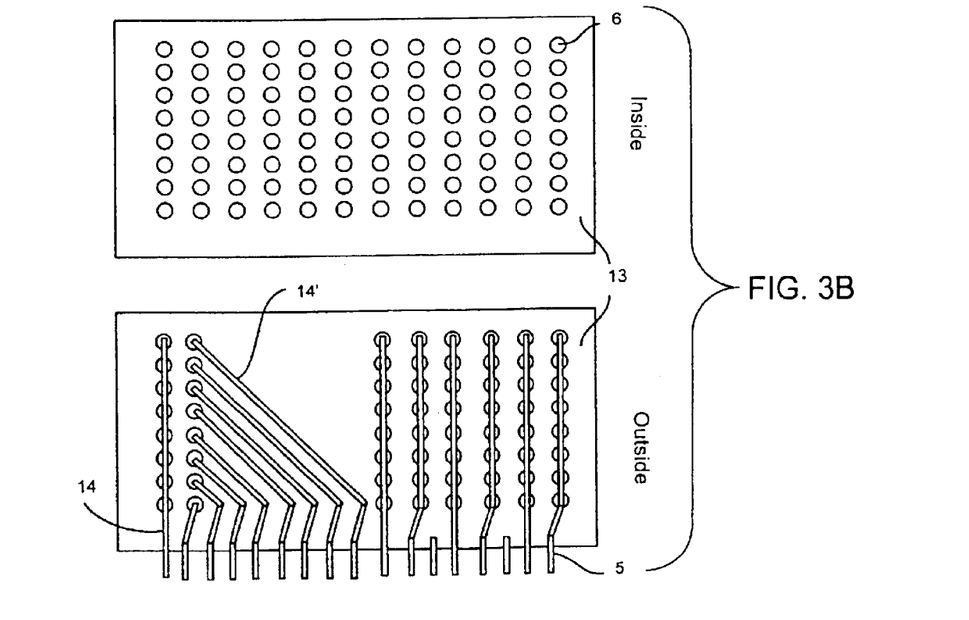

In the drawings of FIGS. 3A and 3B, the inner side and outer side respectively of a side wall 12, 13 of two magazine devices are respectively represented for a first type of package (top, side wall 12) and a second type of package (bottom, side wall 13).

For functionally the same or very similar semiconductor devices produced in both types of package, two types of magazine are obtained, each of the two types of magazine having a uniform interface with respect to the testing location. Essentially the same outer dimensions of the magazine devices make the two types of magazine equivalent for testing devices and automatic placement machines. Functionally identical test pieces in different types of package are arranged in the corresponding magazine device. As a consequence, the two types of magazine devices are arranged at the testing locations of the testing device and the test pieces located in the magazine shafts are tested in any desired sequence.

Figure 4:
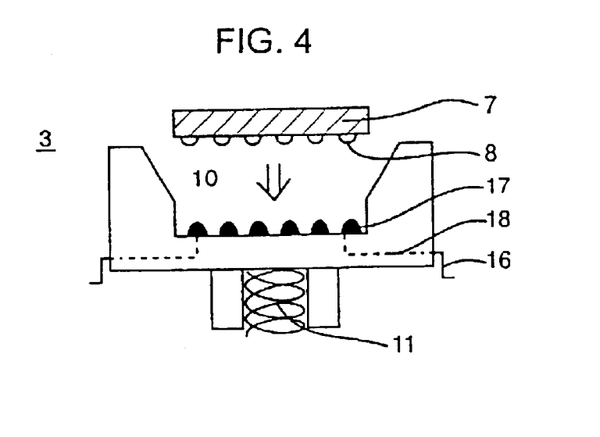
FIG. 4 is a schematic cross-section through a carrier element of the magazine device according to the first exemplary embodiment of the invention.

In FIG. 4, a carrier element 3 of a magazine device 1 is schematically represented in cross section. The carrier element 3 has a receiving device 10 for a semiconductor device 7 in a package of the BGA type (BGA, ball grid array). The geometry of the receiving device 10 has the effect that the test piece 7 is aligned when the carrier element 3 is loaded, so that the contact devices 17 of the carrier element 3 corresponding to contact devices 8 of the test piece 7 lie opposite them.

The contact devices 17 of the carrier element 3 may be contact springs, for instance of the pogo or microspring type, or, as indicated here, of the Elastec® type. Contact devices of the Elastec type are partly metallized silicon cones. The metallization of a silicon cone forms a contact area, which acts together with an electrical line leading to the contact area as a reliable contact spring. This type of contacting makes especially reliable, reversible contacting possible for test purposes. The contact force necessary for this purpose is exerted by the spring force device 11 of a carrier element 3 or a terminating element 19 respectively arranged thereafter. Each of the contact devices 17 is connected via an electrical line 18 to a further electrical contact device 16, which for its part in turn lies opposite a contact device 6 on the inner side of a magazine shaft.

Figure 5:
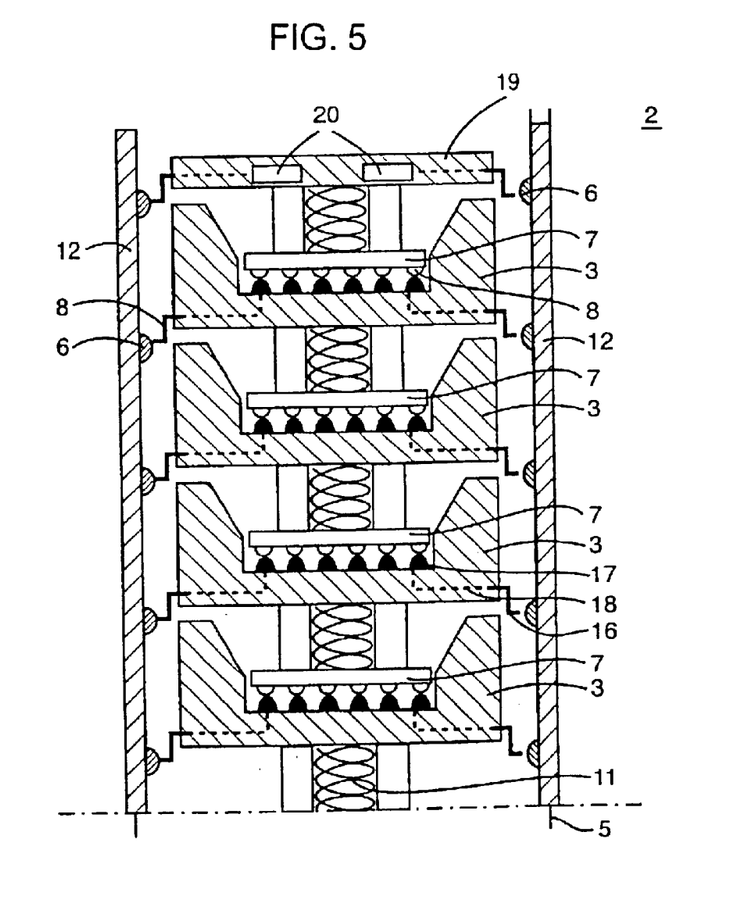
FIG. 5 is a schematic cross-sectional representation of the magazine device according to the first exemplary embodiment.

FIG. 5 shows a magazine shaft 2, wherein four carrier elements 3 and a terminating element 19 are disposed one above the other. The magazine shaft 2, the carrier element 3 and the terminating element 19 form a magazine device 1. In this case, a spring force device 11 arranged on the underside of the carrier element 3 respectively presses a test piece 7, located in a carrier element 3 arranged thereunder, against the contact devices 17 of the assigned carrier element 3. The test piece 7 arranged uppermost in the magazine shaft 2 is pressed by the spring force device 11 of a terminating element 19 against the contact devices 17 of the carrier element 3 arranged thereunder.

In addition, the terminating element 19 contains terminating impedances 20, which can be contacted via contact devices 16 of the terminating element 19 and contact devices 6 on the inner side of the magazine shaft 2.

Figure 1:
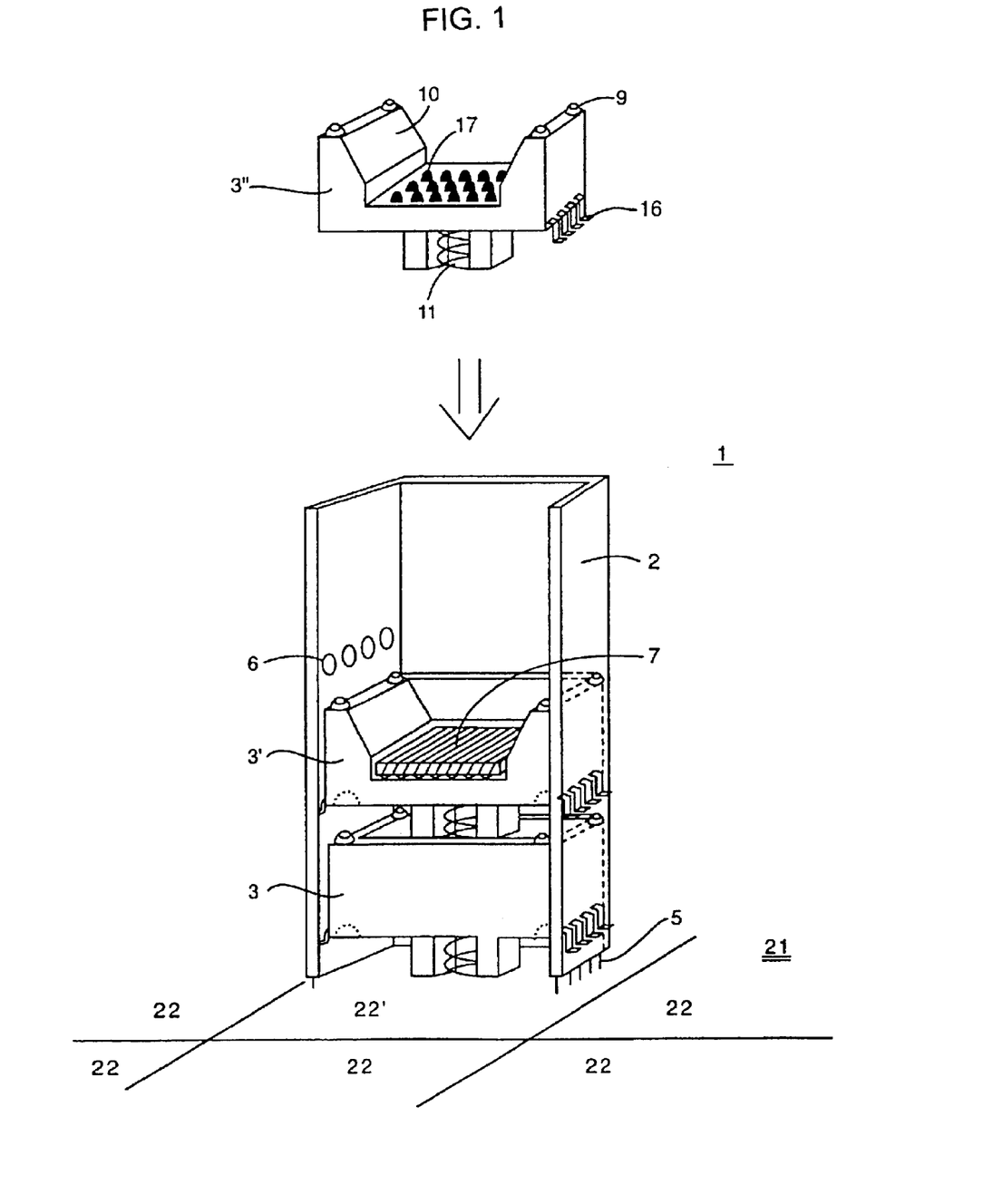
FIG. 1 is a perspective and schematic representation of a magazine device with carrier elements according to a first exemplary embodiment of the invention.

FIG. 1 represents a magazine device 1, comprising a magazine shaft 2 and three carrier elements 3, 3', 3". For better understanding, the carrier element 3' is depicted without a front side, the carrier element 3" without a front side and rear side. Furthermore, on the carrier element 3", arresting and adjusting devices 9 are indicated on the surface facing upward in the magazine shaft 2.

Contact devices 5 are disposed at a shaft end respectively facing testing locations 22, 22' on a magazine shaft 2. The contact devices 5 form an electrical interface with respect to the testing locations 22, 22'. The testing locations 22, 22' are a component part of the testing device 21, and may be arranged on a test board.

We claim:

1. A method for testing a plurality of semiconductor devices on a programmable testing device having at least one testing location with a plurality of first electrical contact devices defining a testing location interface, the method which comprises:

providing a plurality of magazine devices each having a magazine shaft, a plurality of second electrical contact devices defining a first magazine interface, forming a counterpart to the testing location interface of the testing device, and each having a plurality of second magazine interfaces, formed by third electrical contact devices, for contacting a respective semiconductor device to be tested;

thereby providing a given magazine type for similar types of semiconductor devices enabled for testing with substantially a same set of testing signals and test patterns independently of one of a terminal assignment and a type of package thereof;

thereby providing each magazine type, respectively provided for mutually different semiconductor devices, with an identical first magazine interface with respect to the testing device;

arranging semiconductor devices to be tested one above the other in a magazine shaft of a magazine device;

mechanically fastening and contacting the magazine shaft on the testing location; and simultaneously testing a stack of similar semiconductor devices in the magazine shaft; and testing mutually different types of semiconductor devices in different types of package one after another substantially without conversions on the testing device.

2. The method according to claim 1, wherein the similar types of semiconductor devices are functionally identical semiconductor devices.

3. The method according to claim 1, which comprises providing each type of magazine with an identical magazine interface with respect to an automatic placement machine on the testing device.

4. The method according to claim 1, which comprises placing a terminating element above the semiconductor device uppermost in the magazine shaft.

5. The method according to claim 1, which comprises disposing one or a plurality of semiconductor devices on a carrier element in each of the magazine shafts of the magazine devices.

6. The method according to claim 5, which comprises providing each carrier element with contact devices for the semiconductor devices, contact devices with respect to the magazine shaft, and electrical lines for connecting the contact devices of each carrier element to the contact devices of the magazine, and electrically connecting each semiconductor device to the magazine shaft via a carrier element.

7. A magazine device assembly for testing a plurality of functionally identical or similar types of semiconductor devices, the semiconductor devices being enabled for testing with substantially the same set of testing signals and test patterns independently of a terminal assignment or a type of package, and the testing to be carried out on a programmable testing device having at least one testing location with a testing location interface having a plurality of first contact devices, the magazine device assembly comprising:

a plurality of magazine devices each formed as a magazine shaft, each said magazine device having a first magazine interface forming a counterpart to the testing location interface and having second contact devices;

a plurality of second magazine interfaces having a plurality of electrical contact devices for receiving a plurality of stacked semiconductor devices; and said magazine shafts having identical magazine interfaces with respect to the testing device for functionally identical and similar semiconductor devices in different types of package.

8. The magazine device assembly according to claim 7, wherein the stacked semiconductor devices are disposed next to one another.

9. The magazine device assembly according to claim 7, wherein the stacked semiconductor devices are disposed one above another.

10. The magazine device assembly according to claim 7, wherein the first contact devices and said second contact devices are electrical or optical contacts.

11. The magazine device assembly according to claim 7, wherein magazine shafts of different types of magazine have an identical magazine interface with respect to an automatic placement machine for feeding one of test pieces and magazine devices to the testing device.

12. The magazine device assembly according to claim 7, wherein each said magazine device has a variable number of carrier elements, each said carrier element respectively having at least one receiving device for receiving a single semiconductor device in each case and said carrier elements respectively provided with at least one semiconductor device form a stack of semiconductor devices.

13. The magazine device assembly according to claim 12, wherein said carrier elements are stacked next to one another or one above the other in said magazine shaft.

14. The magazine device assembly according to claim 12, wherein said receiving device of each said carrier element has a geometrical form for aligning a semiconductor device loaded thereon.

15. The magazine device assembly according to claim 12, wherein said carrier elements respectively have at least one adjusting device for adjusting the semiconductor device.

16. The magazine device assembly according to claim 12, wherein said carrier elements respectively have at least one arresting device for arresting the semiconductor device.

17. The magazine device assembly according to claim 12, wherein said carrier elements have a geometrical form permitting air circulation between respective two semiconductor devices arranged next to one another or one above the other in said magazine shaft.

18. The magazine device assembly according to claim 12, wherein said carrier elements each have first contact devices on a surface respectively facing the semiconductor device loaded thereon, second contact devices on surfaces facing an inner side of said magazine shaft, and electrically conducting connections between said first contact devices and corresponding said second contact devices.

19. The magazine device assembly according to claim 18, wherein said contact devices, are at least partly formed by Elastec® technology.

20. The magazine device assembly according to claim 12, which further comprises a terminating element, to be disposed after a semiconductor device arranged last in said magazine shaft for fixing said carrier elements and semiconductor devices arranged in said magazine shaft.

21. The magazine device assembly according to claim 20, which further comprises terminating impedances disposed on said terminating element.

* * * * *